United States Patent
Hwang

(10) Patent No.: US 7,361,536 B2
(45) Date of Patent: Apr. 22, 2008

(54) METHOD OF FABRICATION OF A FIELD EFFECT TRANSISTOR WITH MATERIALISTICALLY DIFFERENT TWO ETCH STOP LAYERS IN AN ENHANCED MODE TRANSISTOR AND AN DEPLETION MODE TRANSISTOR

(75) Inventor: Kiuchul Hwang, Amherst, NH (US)

(73) Assignee: Raytheon Company, Waltham, MA (US)

( * ) Notice: Subject to any disclaimer, the term of this patent is extended or adjusted under 35 U.S.C. 154(b) by 217 days.

(21) Appl. No.: 11/319,843

(22) Filed: Dec. 28, 2005

(65) Prior Publication Data

US 2006/0102932 A1 May 18, 2006

Related U.S. Application Data

(62) Division of application No. 10/854,705, filed on May 26, 2004, now Pat. No. 7,183,592.

(51) Int. Cl.
*H01L 21/338* (2006.01)

(52) U.S. Cl. ............... 438/167; 257/194; 257/195; 257/E29.246; 257/E29.247; 257/E29.248; 257/E29.249; 438/172

(58) Field of Classification Search ............ 438/167, 438/172; 257/194, 195, 10, 11, 190, E29.246, 257/E29.247, E29.248, E29.249, E29.251, 257/E29.403, E29.407
See application file for complete search history.

(56) References Cited

U.S. PATENT DOCUMENTS 5,686,741 A * 11/1997 Ohori et al. ............. 257/192

| 6,274,893 | B1 | 8/2001 | Igarashi et al. |
| 6,670,652 | B2 | 12/2003 | Song |
| 6,703,638 | B2 * | 3/2004 | Danzilio ............ 257/12 |
| 2002/0177261 | A1 | 11/2002 | Song |
| 2003/0168672 | A1 * | 9/2003 | Takazawa et al. ...... 257/190 |
| 2005/0110054 | A1 * | 5/2005 | Wohlmuth .............. 257/267 |

FOREIGN PATENT DOCUMENTS

EP 1 261 035 A2 11/2002
EP 1 261 035 A3 11/2002

OTHER PUBLICATIONS

PCT/US2005/017710 International Search Report dated Dec. 12, 2005.

* cited by examiner

*Primary Examiner*—W. David Coleman
*Assistant Examiner*—Su C. Kim
(74) *Attorney, Agent, or Firm*—Daly, Crowley, Mofford & Durkee, LLP

(57) ABSTRACT

A semiconductor structure a structure with an enhancement mode transistor device disposed in a first region and depletion mode transistor device disposed in a laterally displaced second region. The structure has a channel layer for the depletion mode and enhancement mode transistor devices. An enhancement mode transistor device InGaP etch stop/ Schottky contact layer is disposed over the channel layer; a first layer different from InGaP disposed on the InGaP layer; a depletion mode transistor device etch stop layer is disposed on the first layer; and a second layer disposed on the depletion mode transistor device etch stop layer. The depletion mode transistor device has a gate recess passing through the second layer and the depletion mode transistor device etch stop layer and terminating in the first layer. The enhancement mode transistor device has a gate recess passing through the second layer, the depletion mode transistor device etch stop layer, the first layer, and terminating in the InGaP layer.

7 Claims, 6 Drawing Sheets

METHOD OF FABRICATION OF A FIELD EFFECT TRANSISTOR WITH MATERIALISTICALLY DIFFERENT TWO ETCH STOP LAYERS IN AN ENHANCED MODE TRANSISTOR AND AN DEPLETION MODE TRANSISTOR

CROSS REFERENCE TO RELATED APPLICATIONS

This application is a Divisional Application of prior application Ser. No. 10/854,705 filed on May 26, 2004 now U.S. Pat. No. 7,183,592 entitled "Field Effect Transistor" and is incorporated herein by reference.

TECHNICAL FIELD

This invention relates to field effect transistors and more particularly to High Electron Mobility Field Effect Transistors (HEMTs) having enhanced noise margins and threshold voltage uniformity.

BACKGROUND

As is known in the art, there are several types of active devices used at microwave and millimeter wave frequencies to provide amplification of radio frequency signals. In general, one of the more common semiconductor devices used at these frequencies are field effect transistors, in particularly metal semiconductor field effect transistors (MESFETs) and high electron mobility transistors (HEMTs). Each of these transistors is provided from Group III-V materials such as gallium arsenide. What distinguishes a HEMT from a MESFET is that in a HEMT charge is transferred from a doped charge donor layer to an undoped channel layer whereas in a MESFET the charge layer and the channel layer are the same layer. Due to the presence of an undoped channel layer in a HEMT, charge transport properties of the undoped channel layer are better than those of the doped channel layer of a MESFET type structure. Accordingly, HEMTs provide higher frequency operation than MESFETs.

In a HEMT, the charge donor layer is generally a wide bandgap material, such as aluminum gallium arsenide whereas the channel layer is a lower bandgap material, such as gallium arsenide or indium gallium arsenide. It is to be noted that bandgap refers to the potential gap between balance and conduction bands of the semiconductor materials.

In general, there are two types of HEMT structures. One type is simply referred to as a HEMT, whereas the other type is referred to as a pseudomorphic HEMT, or HEMT. The difference between the HEMT and the pseudomorphic HEMT is that in the pseudomorphic HEMT one or more of the layers incorporated into the HEMT structure is comprised of a material having a lattice constant which differs significantly from the lattice constants of the other materials of the device. Thus, due to resulting lattice constant mismatch, the crystal structure of the material providing the channel layer is strained.

As noted above, in a HEMT structure, charge is transferred from the donor layer to an undoped channel layer. For Group III-V materials, a doped charge donor layer is comprised of a wide bandgap material, such as gallium aluminum arsenide, whereas the channel layer is typically comprised of a material having better electron transport properties. Typically, a lower bandgap material, such as gallium arsenide is used. In a pseudomorphic HEMT, the undoped gallium arsenide channel layer is replaced by a channel layer comprised of a lower bandgap material, such as indium gallium arsenide. In either event, however, each of the HEMT and pseudomorphic HEMT structures are used to provide amplification of high frequency microwave and millimeter wave signals.

For low noise and high frequency applications of high electron mobility transistors, it is important to have a narrow recess disposed through the contact layers of the device and over the charge donor layer. That is, the recess opening is preferably only slightly longer than the gate length of the gate electrode disposed within the recess. This arrangement has provided HEMTs and pseudomorphic HEMTs that have relatively high frequency operating characteristics and relatively low noise figures. For power applications in MESFETs, it is generally known that a recessed opening larger than the gate is necessary to provide the MESFET having relatively high gate to drain breakdown voltage characteristics.

Returning to a HEMT, on the etched gallium aluminum arsenide surface which is generally the upper surface in most HEMT structures, there exists a large number of surface states. Such surface states also exist on the GaAs surface. Some authors have estimated the surface states to be as many as $10^{14}$ cm$^{-2}$. These states most likely arise from gallium and aluminum oxides. It has been suggested that these states once occupied, increase the gate to drain breakdown voltage characteristic by capturing electrons and thus decreasing the electric field concentrated at the gate metal edge on the drain side of the transistor.

The breakdown voltage characteristics of high electron mobility transistors has limited their use to relatively low power, low noise applications. This follows since the output impedance of a HEMT is generally related to the drain bias level. Low breakdown voltage characteristics limits the operating drain voltage of a HEMT. For a given DC power level, it is general advantageous to bias a HEMT for high power applications at relatively high drain voltages and low drain current rather than vice versa. Biased at high drain voltage provides a higher output impedance for the HEMT and therefore a more easy impedance match to a 50 ohm system characteristic impedance which is generally encountered in most applications. In particular, this match is more easily made over broad ranges of operating frequencies. Further, to provide high levels of RF voltage gain from such a device it is generally necessary to operate the device at a relatively high drain voltage DC bias. However, as indicated above, although it would be desirable to bias HEMTs at higher breakdown voltage, such is generally not possible since the HEMTs have relatively low breakdown voltage characteristics.

Therefore, high electron mobility transistors are used in relatively low power, low noise, applications, because the known high electron mobility transistors generally have relatively low gate to drain reverse breakdown voltage characteristics. This situation is undesirable since the high frequency characteristics of HEMTs and the relatively high gain of HEMTs in comparison to MESFETs, would otherwise be useful for higher power applications.

As is also known in the art, in some applications it is desirable to have some transistors on a substrate operate with, for example, radio frequency signals, while other transistors of the same substrate provide high-speed digital logic functions. One type of high-speed logic using HEMTs is a Direct Coupled FET Logic (DCFL) circuit. In such application, a plurality of FETs has different threshold values for example, a DFET (Depletion type FET) and an EFET (Enhancement type FET) formed on the same semiconductor substrate.

More particularly, Enhancement/Depletion (E/D) pHEMT technology appears to be the next step in the evolution of multifunction MMIC technology for use on such things as electronically steered arrays for radar, communication systems. E/D pHEMT offers a significant improvement in performance, size and cost over conventional GaAs based multifunction MMIC technology. One drawback implementing Direct Coupled FET Logic (DCFL) with GaAs based pHEMT is the low voltage swing (approximately 600 mv). This low voltage swing is due to the intrinsic material property of AlGaAs with 23% aluminum mole fraction. Also, in order to implement good performance DCFL, another important factor is to have uniform threshold voltage across the wafer.

SUMMARY

In accordance with the present invention, a semiconductor structure is provided having a III-V substrate structure with an enhancement mode transistor device disposed in a first region of the structure and depletion mode transistor device disposed in a laterally displaced second region of the structure. The structure has a channel layer for the depletion mode and enhancement mode transistor devices. The structure includes: an enhancement mode transistor device InGaP etch stop/Schottky contact layer disposed over the channel layer; a first layer disposed on the InGaP layer; a depletion mode transistor device etch stop layer disposed on the first layer; and a second layer disposed on the depletion mode transistor device etch stop layer. The depletion mode transistor device has a gate recess passing through the second layer and the depletion mode transistor device etch stop layer and terminating in the first layer. The enhancement mode transistor device has a gate recess passing through the second layer, the depletion mode transistor device etch stop layer, the first layer, and terminating in the InGaP layer. The material of the first layer is different from InGaP.

With such structure, since the materials used for the first layer on the InGaP layer is a material different from InGaP, the etch stopping effectiveness of the InGaP layer is increased.

In one embodiment, the depletion mode transistor device includes a gate electrode in Schottky contact with the first layer and the enhancement mode device includes a gate electrode in Schottky contact with the InGaP layer.

In accordance with one feature of the present invention, a semiconductor structure is provided having a III-V substrate structure with an enhancement mode transistor device disposed in a first region of the structure and depletion mode transistor device disposed in a laterally displaced second region of the structure. The structure has a channel layer for the depletion mode and enhancement mode transistor devices. The structure includes an enhancement mode transistor device InGaP etch stop/Schottky contact layer disposed over the channel layer; an AlGaAs layer disposed on the InGaP layer; an AlAs depletion mode transistor device etch stop layer disposed on the AlGaAs layer; a GaAs layer disposed on the AlAs depletion mode transistor device etch stop layer. The depletion mode transistor device has a gate recess passing through the GaAs layer and the AlAs depletion mode transistor device etch stop layer and terminating in the AlGaAs layer. The enhancement mode transistor device has a gate recess passing through the GaAs layer, the AlAs depletion mode transistor device etch stop layer, the AlGaAs layer, and terminating in the InGaP layer.

In one embodiment, the depletion mode transistor device includes a gate electrode in Schottky contact with the AlGaAs layer and the enhancement mode device includes a gate electrode in Schottky contact with the InGaP layer.

In one embodiment, the structure includes a second GaAs layer and includes source and drain electrodes for the transistor devices in ohmic contact with the second GaAs layer.

In one embodiment, the InGaP layer is $In_{0.48}Ga_{0.52}P$, such layer being lattice matched to the first-mentioned GaAs and $Al_{0.23}GaAs$ layer thereby reducing strain built up in the structure.

In accordance with another feature of the invention, a method is provided for forming a III-V a substrate structure having an enhancement mode transistor device disposed in a first region of the structure and depletion mode transistor device disposed in a laterally displaced second region of the structure, such structure having a channel layer for the depletion mode and enhancement mode transistor devices. The method includes providing an enhancement mode transistor device InGaP etch stop layer over the channel layer, a first layer on the InGaP layer; an depletion mode transistor device etch stop layer on the first layer; and a second layer on the depletion mode transistor device etch stop layer. The method includes providing a first mask having a window disposed over the first region of the structure, such first mask masking the second region of the structure. An etch is brought into contact with portions of the first region of the structure exposed by the window forming a first recess passing through the second layer, through the depletion mode transistor device etch stop layer, and terminating in the first layer. The first mask is removed. A second mask is provided over the etched structure, such second mask having a window disposed over the second region of the structure, such second mask masking the first region of the structure. An etch is brought into contact with portions the second region of the structure exposed by the window to form a second recess in the second region, such second recess passing through the second layer, through the depletion mode transistor device etch stop layer, through the first layer, and terminating in the InGaP layer. The material used for the first layer is different from InGaP.

With such method, because the material used for the layer on the InGaP layer is a material different from InGaP the etch stop effectiveness of the InGaP layer is increased.

In accordance with another feature of the invention, a method is provided for forming a III-V a substrate structure having an enhancement mode transistor device disposed in a first region of the structure and depletion mode transistor device disposed in a laterally displaced second region of the structure, such structure having a channel layer for the depletion mode and enhancement mode transistor devices. The method includes providing an enhancement mode transistor device InGaP etch stop layer over the channel layer, an AlGaAs layer on the InGaP layer; an AlAs depletion mode transistor device etch stop layer on the AlGaAs layer; and a GaAs layer on the AlAs depletion mode transistor device etch stop layer. The method includes providing a first mask over the etched structure, such first mask having a window disposed over the first region of the structure, such first mask masking the second region of the structure. An etch is brought into contact with portions of the first region of the structure exposed by the window to form a first recess into the GaAs layer and then into the AlAs layer and terminating in the AlGaAs layer. The first mask is removed. A second mask is provided over the etched structure, such second mask having a window disposed over the second region of the structure, such second mask masking the first region of the structure. An etch is brought into contact with portions second region of the structure exposed by the window to form a second recess into the GaAs layer, then into the AlAs layer, then into the AlGaAs layer and terminating in the InGaP layer.

In one embodiment, a gate electrode is formed in Schottky contact with the AlGaAs layer in the first region and a gate electrode is formed in Schottky contact with the InGaP layer in the second region.

In one embodiment, a second GaAs layer is formed and source and drain electrodes are formed for the transistor devices in ohmic contact with the second GaAs layer.

This invention provides two attributes that enhance the performance and yield of E/D pHEMT circuits: 1) The InGaP provides a significant improvement in etch selectivity to improve the manufacturability and yield of E/D pHEMT multifunction circuits, 2) The larger bandgap of InGaP allows for a larger voltage swing for the digital logic, thus providing better operating margin for the logic circuits and allowing better circuit performance and yield; and, 3) GaAs, $Al_{0.23}$ GaAs, and $In_{0.48}$ GaP are lattice matched, therefore no strain is built on between layers. Therefore Schottky contact on 48% InGaP is not changing associated with strain. 4) 48% InGaP is used both as the infinite etch stop layer against AlGaAs layer and the Schottky layer. More particularly, the invention uses preferably, 48% InGaP, instead of AlGaAs. The bandgap (1.8 eV) at InGaP with 48% Indium mole fraction is wider than that of $Al_{0.23}$ GaAs and InGaAs. Therefore, the voltage swing increases to approximately 800 mv which is 200 mV higher than AlGaAs. This increases the noise margin. In order to implement good performance DCFL, another important factor is to have uniform threshold voltage. The InGaP layer is an excellent selective etching layer, so the uniformity of the threshold voltage across the wafer is another great advantage using InGaP layer. Thus, by introducing wider bandgap material InGaP, the voltage swing has been boosted up to approximately 800 mV and the threshold voltage is very uniform. Also, due to the high selectivity in terms of process and the high Schottky barrier of the InGaP layer, the voltage swing increases by 33%, and the uniformity of the threshold voltage is greater than 95%. In order to implement LSI level digital logic circuits with DCFL, the uniformly of the threshold is a very important factor.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
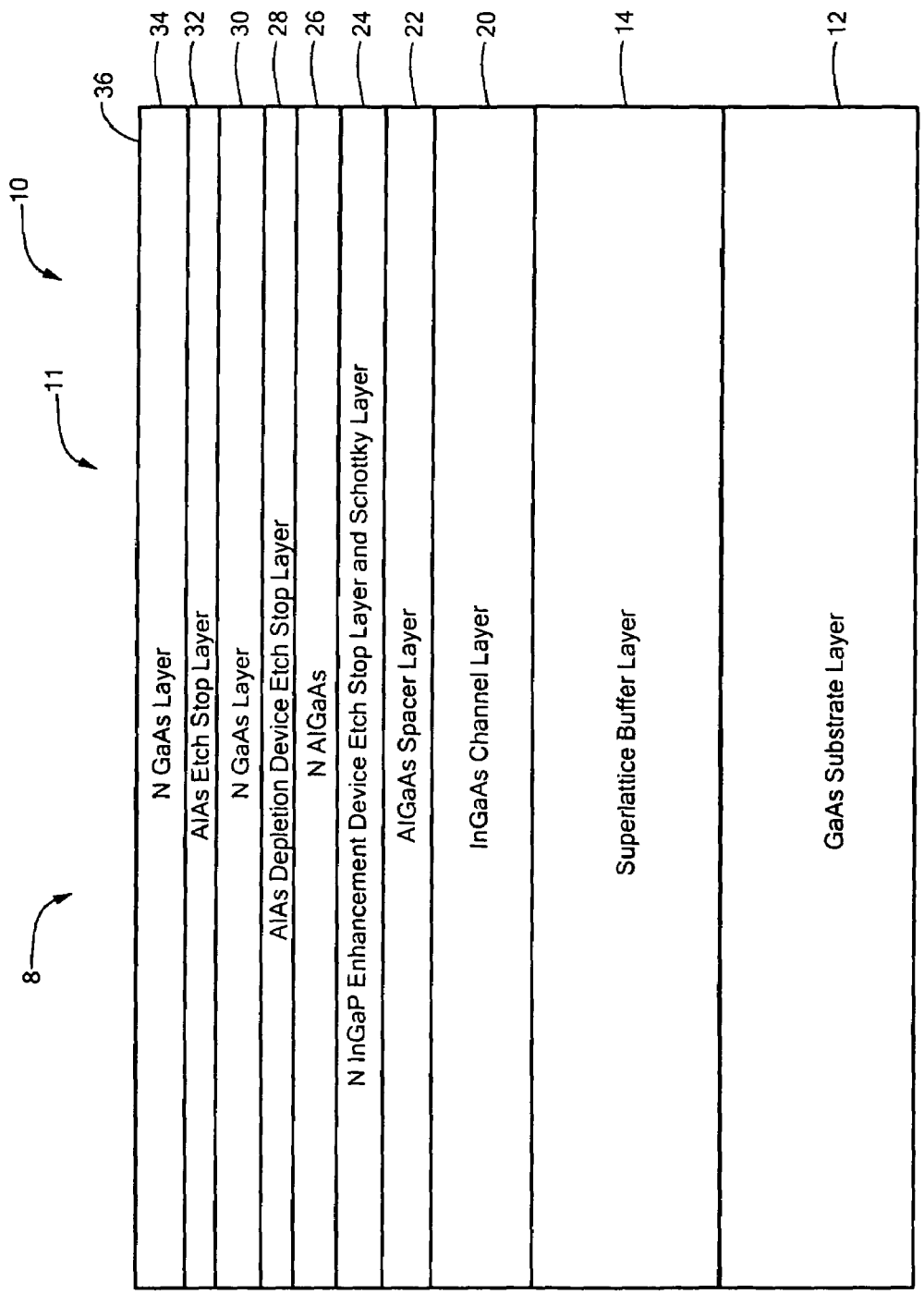
FIGS. 1 through 5 are cross sectional sketches of a semiconductor structure at various stages in the fabrications of an enhancement mode field effect transistor and a depletion mode field effect transistor according to the invention.
Figure 2:
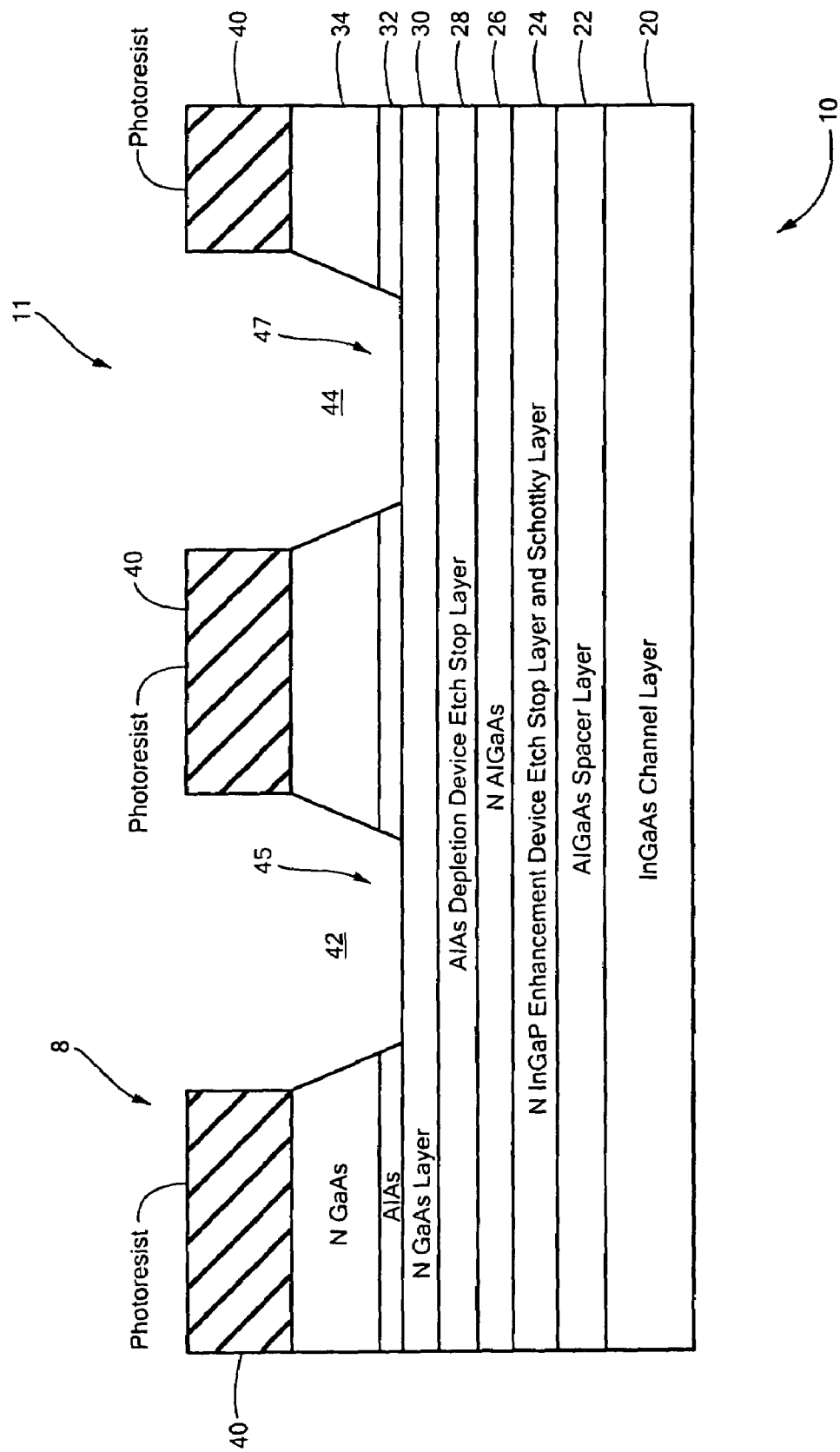
Figure 3:
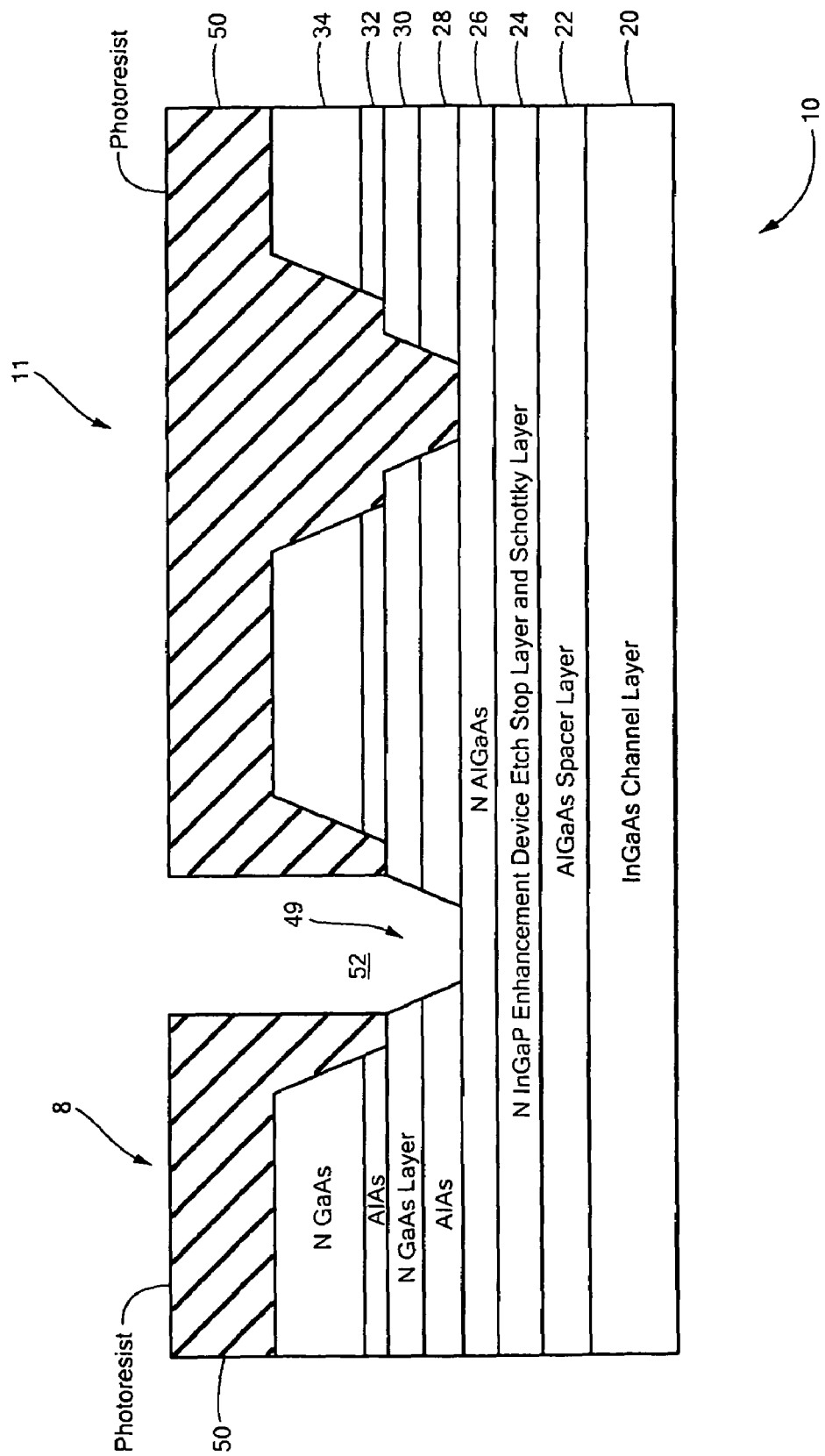
Figure 4:
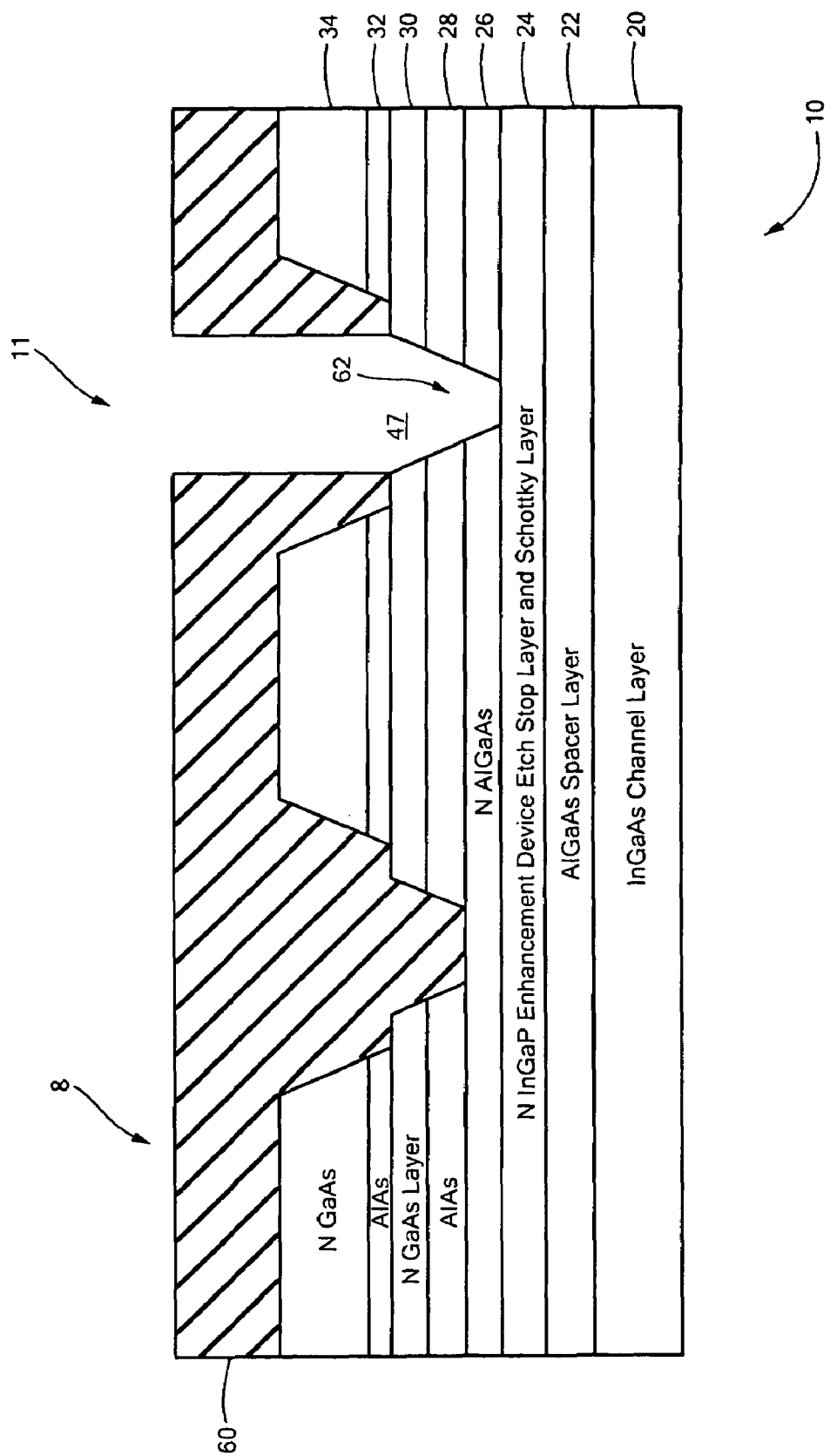

Referring now to FIG. 1, semiconductor structure 10 is shown having a substrate 12, here comprised of semi-insulating III-V, here gallium arsenide (GaAs) or other suitable semiconductor material, is shown having a plurality of layers disposed thereon. As will be described, an enhancement mode transistor device is disposed in a first region 8 of the structure 10 and depletion mode transistor device is disposed in a laterally displaced second region 11 of the structure 10.

In particular, disposed over substrate 12 is a superlattice buffer layer 14 comprised of alternating layer pairs (not shown) of gallium arsenide and aluminum gallium arsenide (AlGaAs), each one of said layers having a typical thickness of 50-100 Angstroms disposed to provide a superlattice as is known in the art.

Disposed over superlattice layer 14 is an $In_xGa_{1-x}As$ channel layer 20 where x is typically between 0.2 and 0.35.

Disposed over channel layer 20 is a wide bandgap material aluminum gallium arsenide spacer layer 22, having a lower undoped spacer region, not shown, having a typical thickness of 30 Angstroms to 50 Angstroms and provides the charge donor region for the channel layer 20.

Disposed over layer 22 is an enhancement device etch stop layer, here N type conductivity Indium Gallium Phosphide (InGaP) layer 24. Layer 24 in addition to providing an etch stop layer also serves to provide a Schottky contact layer for an enhancement mode pHEMT device. Here, InGaP layer is $In_{0.48}Ga_{0.52}P$.

Disposed on the InGaP layer 24 is an N type conductivity type AlGaAs depletion mode transistor device Schottky contact layer 26. Disposed on the AlGaAs layer 26 is an N type conductivity AlAs depletion mode transistor device etch stop layer 28. Disposed on the AlAs depletion mode transistor device etch stop layer 28 is a first N type conductivity GaAs layer 30. Disposed on the first GaAs layer 30 is an N type conductivity AlAs first recess etch stop layer 32. Disposed on the AlAs first recess etch stop layer 32 is a second N type conductivity GaAs layer 34.

Referring now to FIGS. 2-5 the method used to form the enhancement mode and depletion mode devices will be described.

A first mask (FIG. 2) 40 is provided with a window 42 disposed over a portion of the first region 8 and a window 44 disposed over a portion of the second region 11. An etch, here citric acid, is brought into contact with portions on the structure exposed by the windows 42, 44 to form a first recess 45 in the first region 8 and a first recess 47 in the second portion 11 of the structure 10, such first recesses passing through the N type conductive GaAs layer 34 and the AlAs first recess etch stop layer 32 and terminating in the N type conductivity AlGaAs layer 30.

The first mask 40 is removed.

A second mask 50 (FIG. 3) is provided over the etched structure 10, such second mask 50 having a window 52 disposed over the first recess 45 (FIG. 2) etched in the first region 8 of the structure 10, such second mask 50 masking the first recess 47 (FIG. 2) formed in the second region 11 of the structure 10.

An etch, here citric acid, is brought into contact with portions first recess 45 etched in the first region 8 of the structure 10 to extend such first recess 45 into the first GaAs layer and then into the AlAs layer and terminating in the AlGaAs layer. Thus, the recesses in region 8 include a lower narrow portion (i.e., recess 49) in layers 28 and 30 and an upper wider portion (i.e., recess 45, FIG. 2) in layers 30, 32 and 34.

The second mask 50 is removed.

A third mask 60 (FIG. 4) is provided over the etched structure, such third mask 60 having a window 62 disposed over the first recess 47 etched in the second region 11 of the structure 10, such third mask 60 masking the recesses 45, 49 (FIGS. 2 and 3) formed in the first region 8 of the structure 10.

An etch, here citric acid, is brought into contact with portions first recess 47 etched in the second region 11 of the structure 10 to extend such first recess 47 into a second, narrow recess 53 formed in the first N type conductivity GaAs layer 30, then into the AlAs layer 28, then into the N type conductivity AlGaAs layer and into the N type conductivity type, InGaP enhancement mode device etch stop layer and Schottky contact layer 24.

Figure 5:
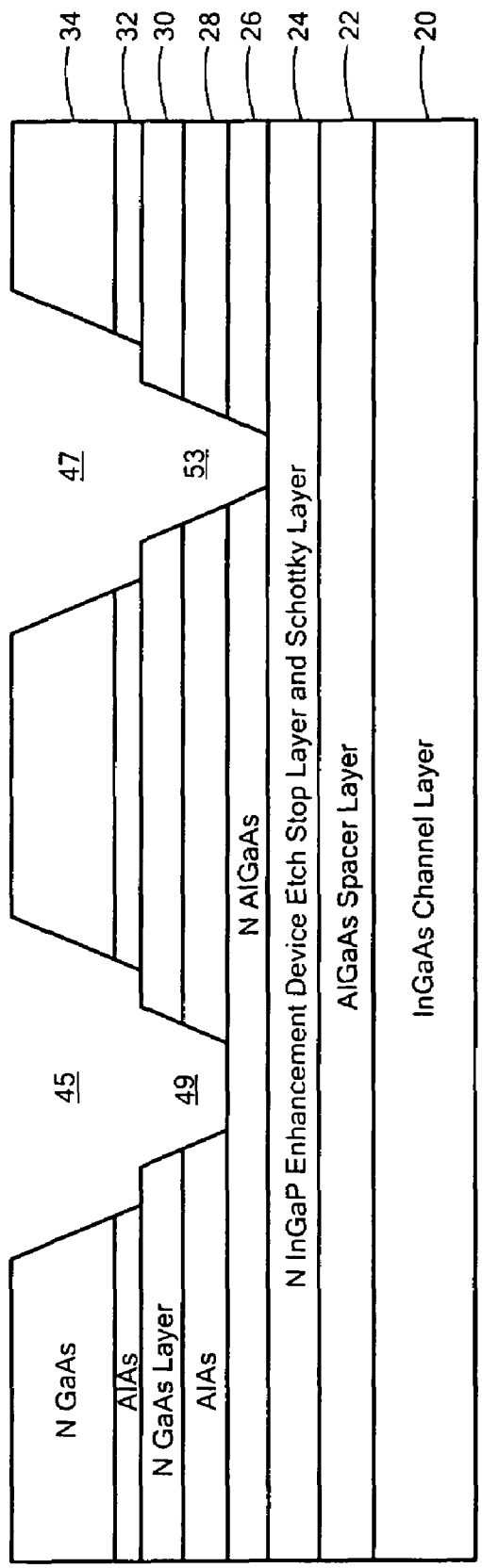

The mask 60 is removed producing the structure shown in FIG. 5.

Figure 6:
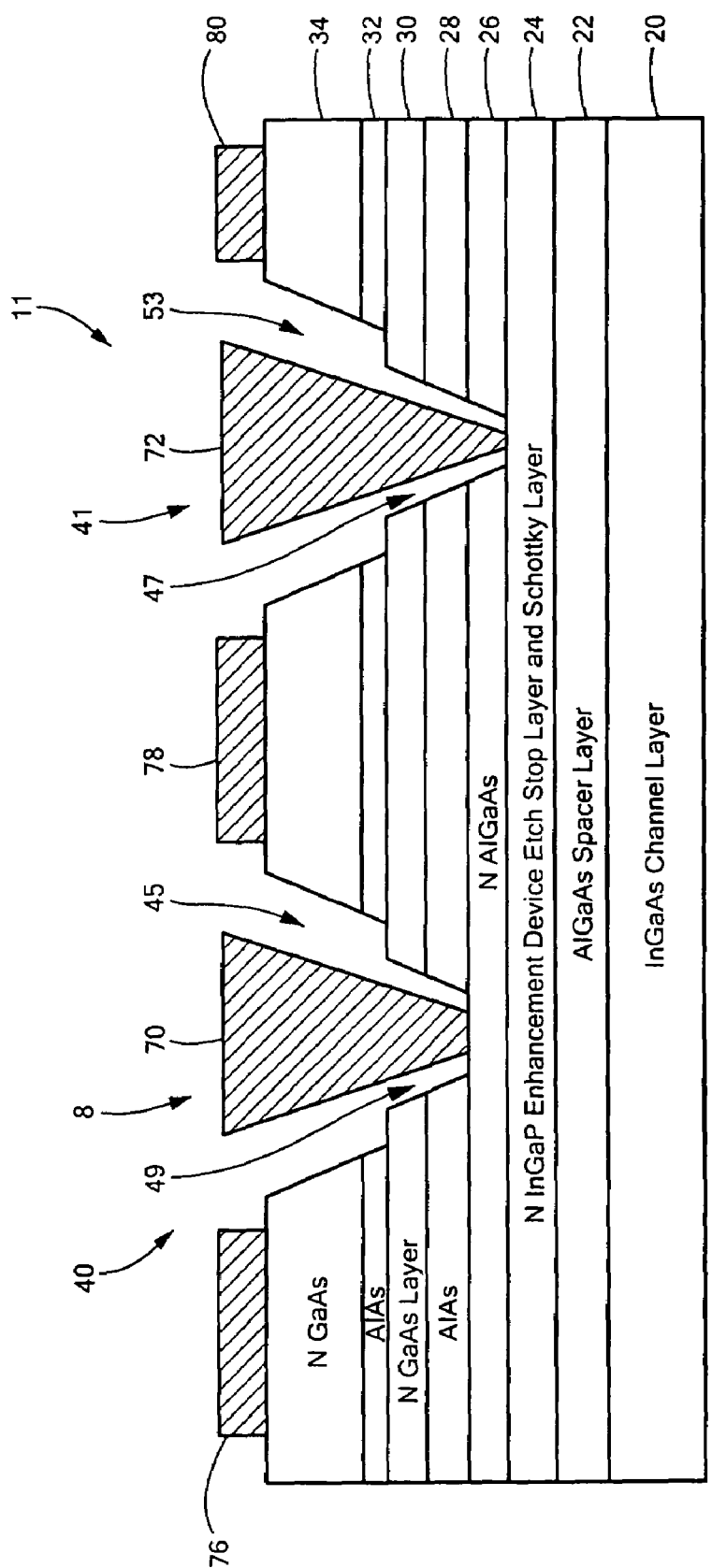
FIG. 6 shows the fabricated enhancement mode field effect transistor and the depletion mode field effect transistor.

Referring to FIG. 6, a gate electrode 70 is formed in Schottky contact with the AlGaAs layer 26 terminating the second recess 49 formed in the first region 8 and a gate electrode 72 is formed in Schottky contact with the InGaP layer 24 terminating the second recess formed in the second region 11.

Source and drain electrodes 76, 78 for the transistor device formed in region 8. A drain electrode 80 is formed in ohmic contact with layer 34.

It is noted that, the depletion mode field effect transistor (FET) device 40 formed in region 8 has a gate recess having a wide portion passing through the second GaAs layer 34 and the AlAs first recess etch stop layer 32 and terminating in a narrow portion. The narrow portion passes through the first GaAs layer 30 and the AlAs depletion mode transistor device etch stop layer 28 and terminates in the AlGaAs layer 26.

The enhancement mode filed effect transistor (FET) device 41 in region 11 has a gate recess having a wide portion passing through the second GaAs layer 34, the AlAs first recess etch stop layer 32 and terminating in a narrow portion. The narrow portion passes through the first GaAs layer 30, the AlAs depletion mode transistor device etch stop layer 28, the AlGaAs layer 26, and terminating in the InGaP layer 24.

The depletion mode transistor device 40 includes a gate electrode 70 in Schottky contact with the AlGaAs layer 26 and the enhancement mode device 41 includes a gate electrode 72 in Schottky contact with the InGaP layer 24. Source and drain electrodes 76, 78 and 80 for the transistor devices 40, 41 are in ohmic contact with the second GaAs layer 36.

The method, as described above, provides an enhancement mode transistor device InGaP etch stop layer over the channel layer, an AlGaAs layer on the InGaP layer; an AlAs depletion mode transistor device etch stop layer on the AlGaAs layer; a first GaAs layer on the AlAs enhancement mode transistor device etch stop layer; an AlAs first recess etch stop layer on the GaAs layer; and a second GaAs layer on the AlAs first recess etch stop layer.

This invention provides two attributes that enhance the performance and yield of E/D pHEMT circuits: 1) The InGaP provides a significant improvement in etch selectivity to improve the manufacturability and yield of E/D pHEMT multifunction circuits; and 2) The larger bandgap of InGaP allows for a larger voltage swing for the digital logic, thus providing better operating margin for the logic circuits and allowing better circuit performance and yield. More particularly, the invention uses preferably, 48% InGaP, instead of AlGaAs. The bandgap (1.8 eV) at InGaP with 48% Indium mole fraction is wider than that of InGaAs. Therefore, the voltage swing increases to approximately 800 mv which is 200 mV higher than AlGaAs. This increases the noise margin. In order to implement good performance DCFL, another important factor is to have uniform threshold voltage. The in GaP layer is an excellent selective etching layer, so the uniformity of the threshold voltage across the wafer is another great advantage using InGaP layer. Thus, by introducing wider bandgap material InGaP, the voltage swing has been boosted up to approximately 800 mV and the threshold voltage is very uniform. Also, due to the high selectivity in terms of process and the high Schottky barrier of the InGaP layer, the voltage swing increases by 33%, and the uniformity of the threshold voltage is greater than 95%. In order to implement LSI level digital logic circuits with DCFL, the uniformly of the threshold is a very important factor.

A number of embodiments of the invention have been described. Nevertheless, it will be understood that various modifications may be made without departing from the spirit and scope of the invention. Accordingly, other embodiments are within the scope of the following claims.

What is claimed is:

1. A method for forming a III-V a substrate structure having an enhancement mode transistor device disposed in a first region of the structure and depletion mode transistor device disposed in a laterally displaced second region of the structure, such structure having a channel layer for the depletion mode and enhancement mode transistor devices, comprising:

providing a structure having: an enhancement mode transistor device InGaP etch stop layer over the channel layer; a first layer on the InGaP layer; an depletion mode transistor device etch stop layer on the first layer; and a second layer on the depletion mode transistor device etch stop layer, the material used for the first layer being different from InGaP;

providing a first mask having a window disposed over the first region of the structure, such first mask masking the second region of the structure;

bringing an etch into contact with portions of the first region of the structure exposed by the window forming a first recess passing through the second layer, through the depletion mode transistor device etch stop layer, and terminating in the first layer;

removing the first mask;

providing a second mask over the etched structure, such second mask having a window disposed over the second region of the structure, such second mask masking the first region of the structure;

bringing an etch into contact with portions the second region of the structure exposed by the window to form a second recess in the second region, such second recess passing through the second layer, through the depletion mode transistor device etch stop layer, through the first layer, and terminating in the InGaP layer.

2. A method for forming a III-V a substrate structure having an enhancement mode transistor device disposed in a first region of the structure and depletion mode transistor device disposed in a laterally displaced second region of the structure, such structure having a channel layer for the depletion mode and enhancement mode transistor devices, comprising:

providing an enhancement mode transistor device InGaP etch stop layer over the channel layer, an AlGaAs layer on the InGaP layer; an AlAs depletion mode transistor device etch stop layer on the AlGaAs layer; and a GaAs layer on the AlAs enhancement mode transistor device etch stop layer;

providing a first mask over the etched structure, such first mask having a window disposed over the first region of the structure, such first mask masking the second region of the structure;

bringing an etch into contact with portions of the first region to form a first recess into the GaAs layer and then into the AlAs layer and terminating in the AlGaAs layer;

removing the first mask;

providing a second mask over the etched structure, such second mask having a window disposed over the second region of the structure, such third mask masking the first region of the structure;

bringing an etch into contact with portions of the second region of the structure to extend to form a second recess in the GaAs layer, then into the AlAs layer, then into the AlGaAs layer and into the InGaP layer.

3. The method recited in claim 2 including forming a gate electrode in Schottky contact with the AlGaAs layer in the first region and forming a gate electrode in Schottky contact with the InGaP layer in the second region.

4. The method recited in claim 3 including forming a second GaAs layer over and including forming source and drain electrodes for the transistor devices in ohmic contact with the second GaAs layer.

5. A method for forming a III-V a substrate structure having an enhancement mode transistor device disposed in a first region of the structure and depletion mode transistor device disposed in a laterally displaced second region of the structure, such structure having a channel layer for the depletion mode and enhancement mode transistor devices, comprising:

providing an enhancement mode transistor device InGaP etch stop layer over the channel layer, an AlGaAs layer on the InGaP layer; an AlAs depletion mode transistor device etch stop layer on the AlGaAs layer; a first GaAs layer on the AlAs enhancement mode transistor device etch stop layer; an AlAs first recess etch stop layer on the GaAs layer; and a second GaAs layer on the AlAs first recess etch stop layer;

providing a first mask with a window disposed over a portion of the first region and a window disposed over a portion of the second region;

bringing an etch into contact with portions on the structure exposed by the windows to form a first recess in the first region and a first recess in the second portion of the structure, such first recesses passing through the second GaAs layer and the AlAs first recess etch stop layer and terminating in the AlGaAs layer;

removing the first mask;

providing a second mask over the etched structure, such second mask having a window disposed over the first recess etched in the first region of the structure, such second mask masking the first recess formed in the second region of the structure;

bringing an etch into contact with portions first recess etched in the first region of the structure to extend such first recess into the first GaAs layer and then into the AlAs layer and terminating in the AlGaAs layer;

removing the second mask;

providing a third mask over the etched structure, such third mask having a window disposed over the first recess etched in the second region of the structure, such third mask masking the first recess formed in the first region of the structure;

bringing an etch into contact with portions first recess etched in the second region of the structure to extend such first recess into the first GaAs layer, then into the AlAs layer, then into the AlGaAs layer and into the InGaP layer.

6. The method recited in claim 5 including forming a gate electrode in Schottky contact with the AlGaAs layer terminating the second recess formed in the first region and forming a gate electrode in Schottky contact with the InGaP layer terminating the second recess formed in the second region.

7. The method recited in claim 6 including forming source and drain electrodes for the transistor devices in ohmic contact with the second GaAs layer.

* * * * *

UNITED STATES PATENT AND TRADEMARK OFFICE
CERTIFICATE OF CORRECTION

PATENT NO. : 7,361,536 B2
APPLICATION NO. : 11/319843
DATED : April 22, 2008
INVENTOR(S) : Kiuchul Hwang It is certified that error appears in the above-identified patent and that said Letters Patent is hereby corrected as shown below:

On the Title Page Item (54), In the Title, delete "AN DEPLETION" and replace with --A DEPLETION--.

On the Title Page Item (57), Abstract, line 1, delete "structure a structure with" and replace with --structure with--.

Col. 1, line 5, Title, delete "AN DEPLETION" and replace with --A DEPLETION--.

Col. 1, line 52, delete "HEMT." and replace with --pHEMT.--.

Col. 2, line 36, delete "limits" and replace with --limit--.

Col. 2, line 38, delete "general" and replace with --generally--.

Col. 2, line 40, delete "current rather than vice versa." and replace with --currents rather than vice-versa--.

Col. 2, line 54, delete "low noise, applications" and replace with --low noise applications,--.

Col. 4, line 16, delete "III-V a substrate" and replace with --III-V substrate--.

Col. 4, line 24, delete "an" and replace with --a--.

Col. 4, line 38, delete "portions the" and replace with --portions of the--.

Col. 4, line 45, delete "such method" and replace with --such a method--.

Col. 4, line 46, delete "InGaP the" and replace with --InGaP, the--.

Col. 4, line 49, delete "III-V a substrate" and replace with --III-V substrate--.

Col. 5, line 4-5, delete "portions second" and replace with --portions of the second--.

Col. 5, line 27, delete "strain. 4)" and replace with --strain, 4)--.

Col. 5, line 39, delete "using InGaP layer." and replace with --using the InGaP layer--.

Col. 5, line 47, delete "uniformly" and replace with --uniformity--.

Col. 6, line 30, delete "InGaP" and replace with --the InGaP--.

Col. 6, line 42, delete "FIGS. 2-5 the" and replace with --FIGS. 2-5, the--.

Col. 6, line 64, delete "portions first" and replace with --portions of the first--.

UNITED STATES PATENT AND TRADEMARK OFFICE
CERTIFICATE OF CORRECTION

PATENT NO. : 7,361,536 B2
APPLICATION NO. : 11/319843
DATED : April 22, 2008
INVENTOR(S) : Kiuchul Hwang It is certified that error appears in the above-identified patent and that said Letters Patent is hereby corrected as shown below:

Col. 7, line 12, delete "portions first" and replace with --portions of the first--.

Col. 7, line 28, delete "device formed" and replace with --device are formed--.

Col. 7, line 38, delete "filed" and replace with --field--.

Col. 8, line 19, delete "uniformly" and replace with --uniformity--.

Col. 8, line 36, delete "an" and replace with --a--.

Col. 8, line 54, delete "portions the" and replace with --portions of the--.

Col. 8, line 61, delete "III-V a substrate" and replace with --III-V substrate--.

Col. 9, line 32, delete "III-V a substrate" and replace with --III-V substrate--.

Col. 10, line 18, delete "portions first" and replace with --portions of the first--.

Col. 10, line 30, delete "portions first" and replace with --portions of the first--.

Signed and Sealed this

Tenth Day of February, 2009

JOHN DOLL
*Acting Director of the United States Patent and Trademark Office*